United States Patent
Brown et al.

(10) Patent No.: US 11,719,533 B2
(45) Date of Patent: Aug. 8, 2023

(54) MODULATION OF SCANNING VELOCITY DURING OVERLAY METROLOGY

(71) Applicant: KLA Corporation, Milpitas, CA (US)

(72) Inventors: David L. Brown, Los Gatos, CA (US); Andrew V. Hill, Sunriver, OR (US); Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 6 days.

(21) Appl. No.: 17/214,888

(22) Filed: Mar. 28, 2021

(65) Prior Publication Data

US 2022/0307825 A1 Sep. 29, 2022

(51) Int. Cl.
*G01B 11/27* (2006.01)

(52) U.S. Cl.
CPC ........ *G01B 11/272* (2013.01); *G01B 2210/56* (2013.01)

(58) Field of Classification Search
CPC .......................... G01B 11/272; G01B 2210/56
USPC ......................................................... 356/400
See application file for complete search history.

(56) References Cited

U.S. PATENT DOCUMENTS

| | | | |
|---|---|---|---|
| 8,947,521 B1 * | 2/2015 | Hill | H04N 5/23296 382/145 |
| 10,684,563 B2 | 6/2020 | Manassen et al. | |
| 2005/0243294 A1 * | 11/2005 | Smith | G03F 7/70791 355/53 |
| 2007/0258074 A1 * | 11/2007 | Moest | G03F 9/7092 355/53 |
| 2009/0050802 A1 * | 2/2009 | Noji | H01J 37/265 250/307 |
| 2013/0170049 A1 * | 7/2013 | Smirnov | G03F 7/70633 359/730 |
| 2016/0003735 A1 | 1/2016 | Seligson et al. | |
| 2018/0088474 A1 * | 3/2018 | Shibazaki | G03F 9/7084 |
| 2018/0122668 A1 | 5/2018 | He et al. | |
| 2018/0220518 A1 | 8/2018 | Polyakov et al. | |
| 2020/0409271 A1 | 12/2020 | Hill et al. | |
| 2021/0096061 A1 | 4/2021 | Hill et al. | |

(Continued)

FOREIGN PATENT DOCUMENTS

| | | | | |
|---|---|---|---|---|
| JP | 2009088142 A | * | 4/2009 | |
| KR | 200300079910 A | * | 10/2003 | B82Y 40/00 |

(Continued)

*Primary Examiner* — Tarifur R Chowdhury
*Assistant Examiner* — Omar H Nixon
(74) *Attorney, Agent, or Firm* — Bever, Hoffman & Harms, LLP

(57) ABSTRACT

A method for imaging overlay targets on a wafer includes (1) using a sensor to acquire images of overlay targets on a wafer while the wafer is in motion and (2) accelerating and decelerating the wafer to move the overlay targets into alignment with the sensor between acquiring images of the overlay targets. Accelerating/decelerating the wafer may include: (1) accelerating the wafer at a maximum acceleration and then decelerating the wafer at a maximum deceleration, (2) accelerating/decelerating the wafer in a triangular waveform pattern, (3) accelerating/decelerating the wafer in a sinusoidal pattern, or (4) accelerating/decelerating the wafer in a near-sinusoidal pattern (created by combining a pure sinusoidal profile with one or more harmonic profiles). A system is also provided for implementing the above method(s).

26 Claims, 13 Drawing Sheets

(56) References Cited

U.S. PATENT DOCUMENTS

2022/0034652 A1  2/2022  Manassen et al.
2022/0214285 A1  7/2022  Hill et al.
2022/0283514 A1  9/2022  Hill et al.

FOREIGN PATENT DOCUMENTS

KR    20150005612 A  *  1/2015  ............. G01B 11/14
WO    2021018627 A1     2/2021

* cited by examiner

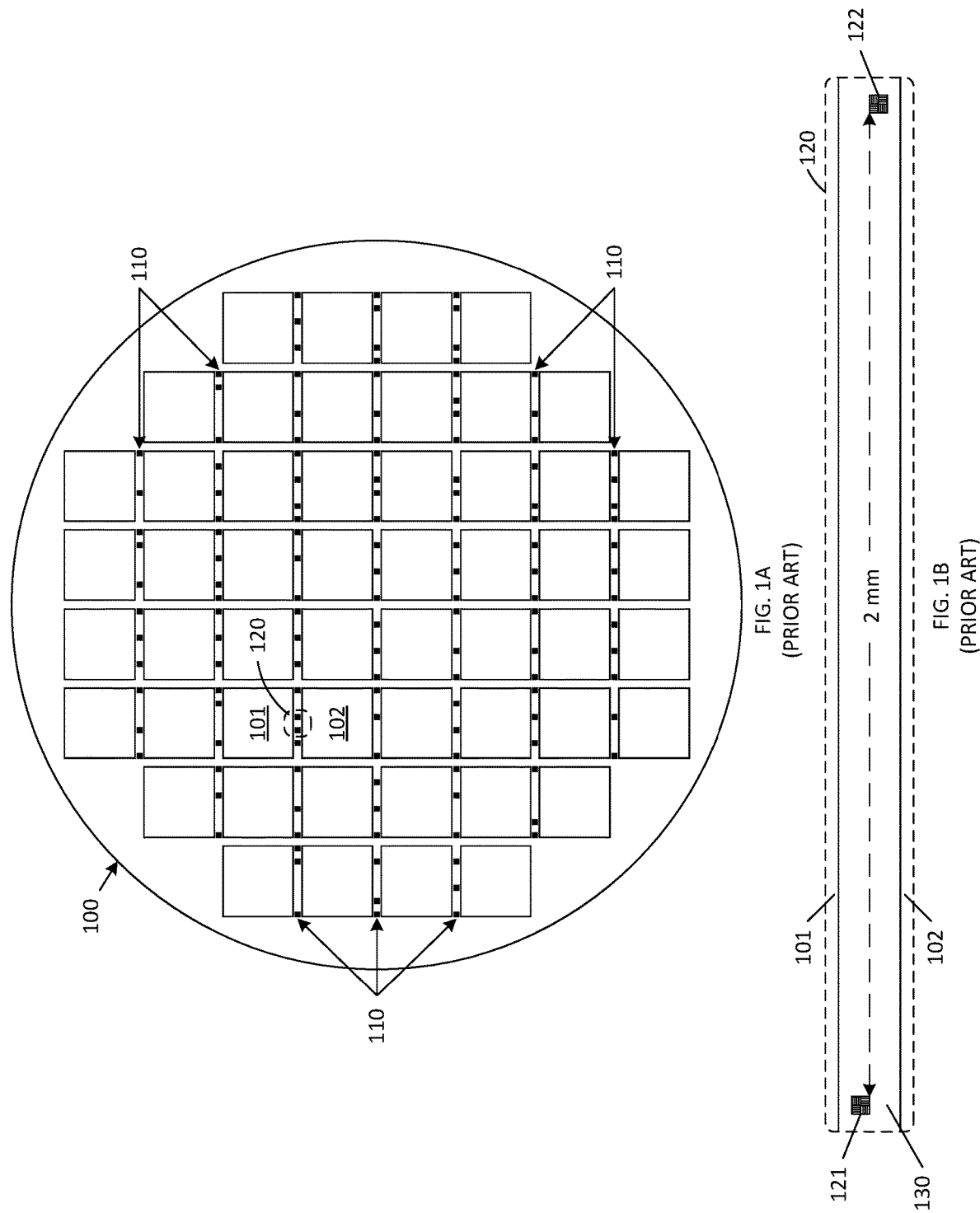

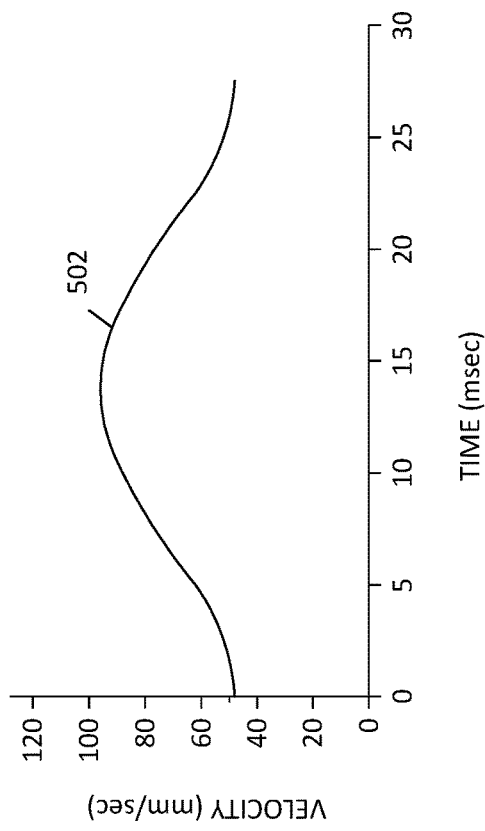
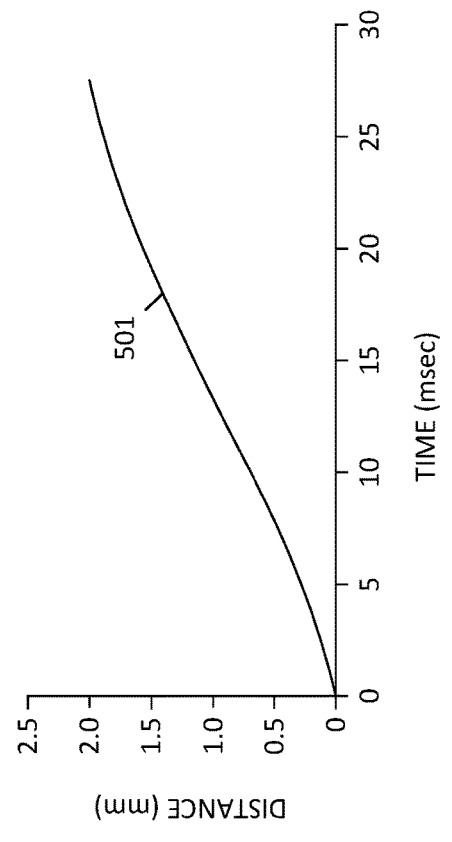
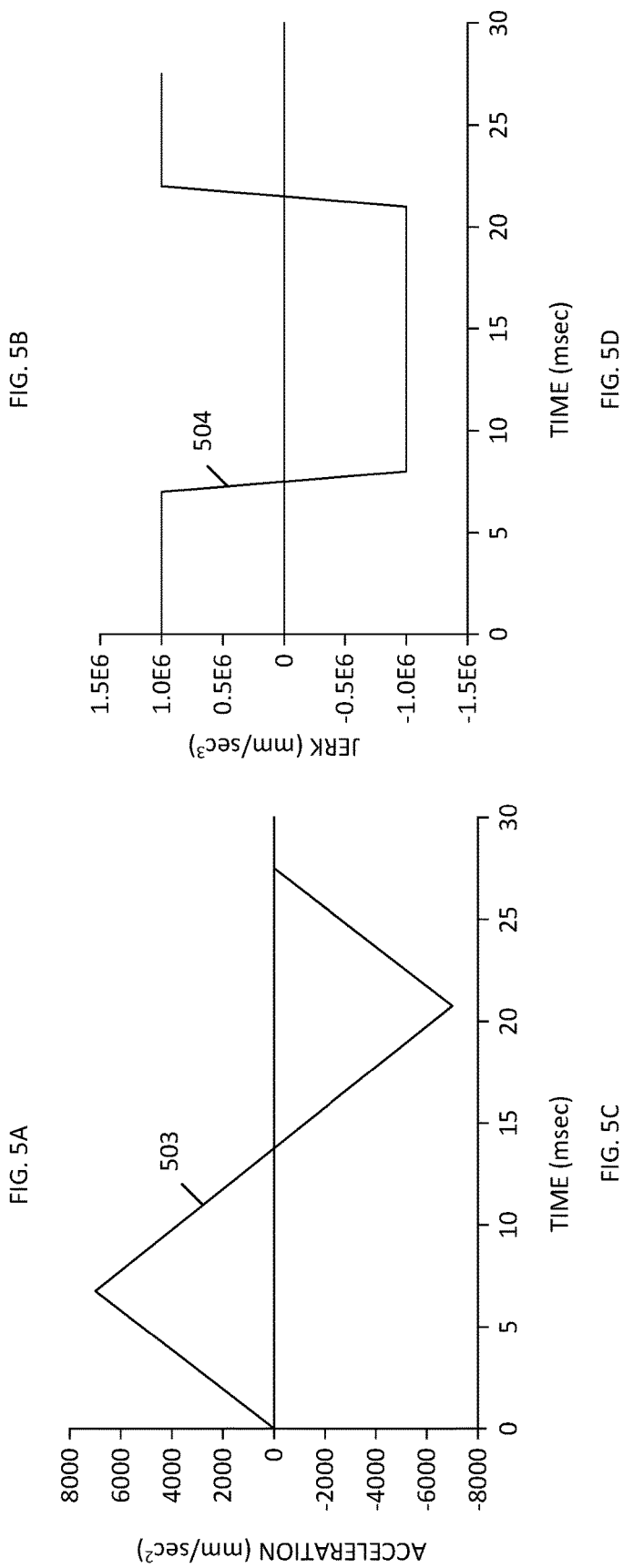

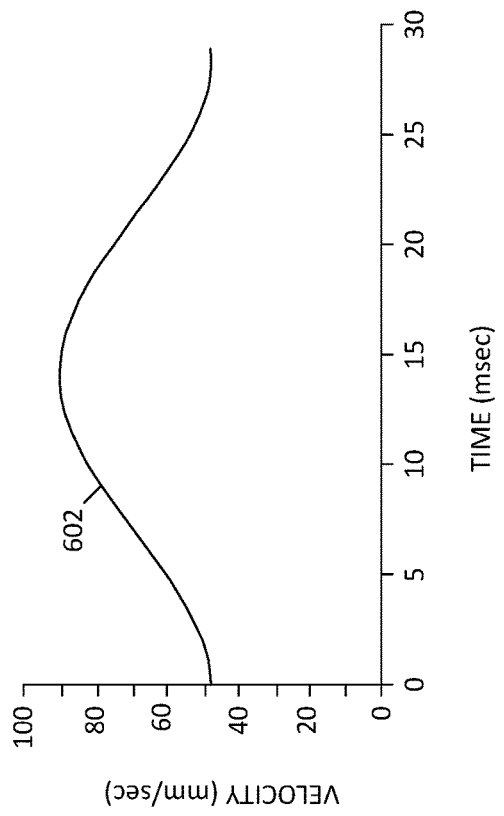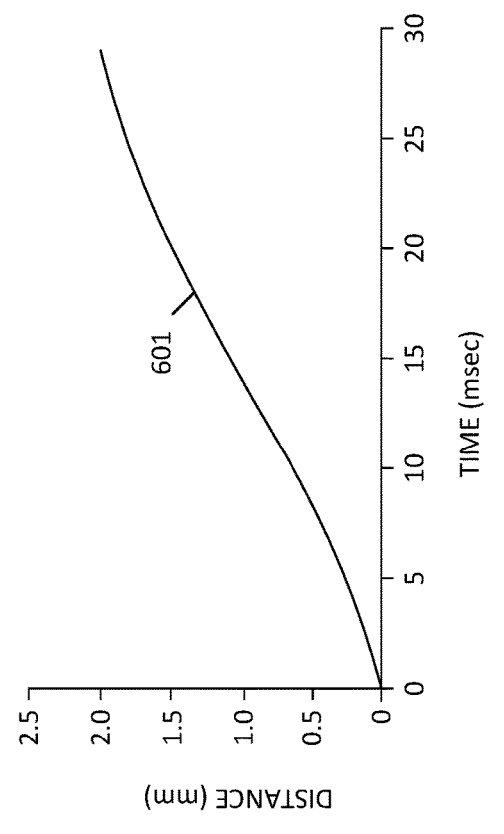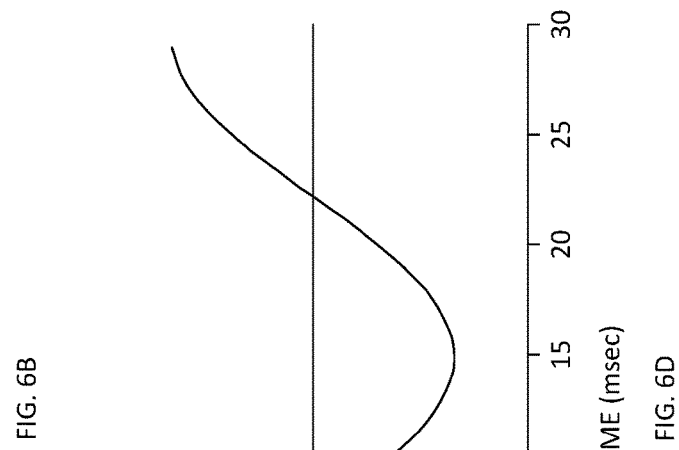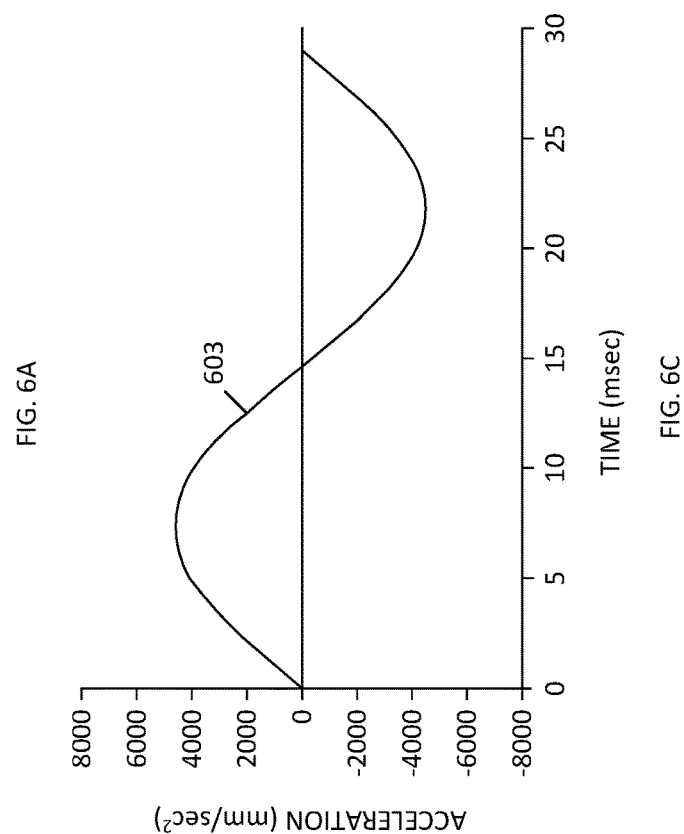

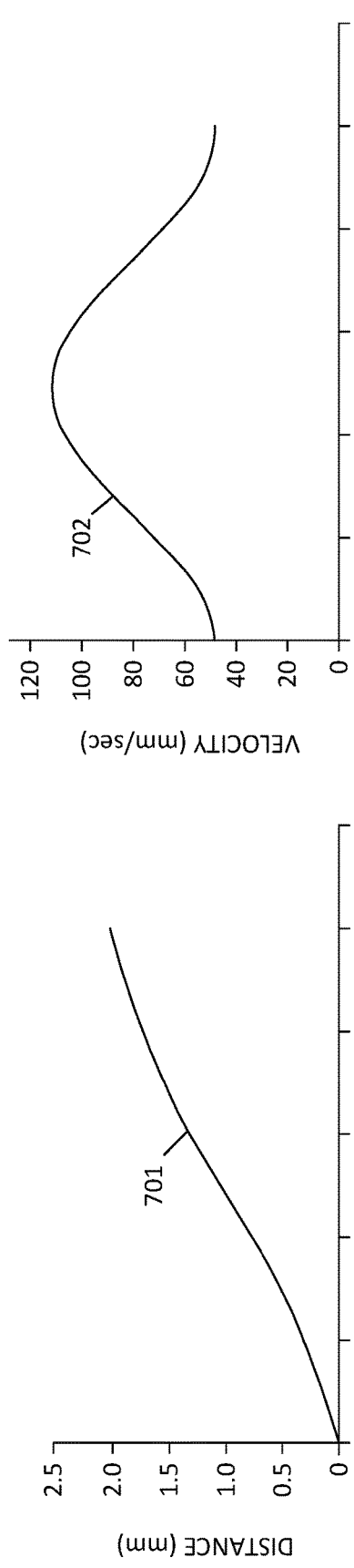
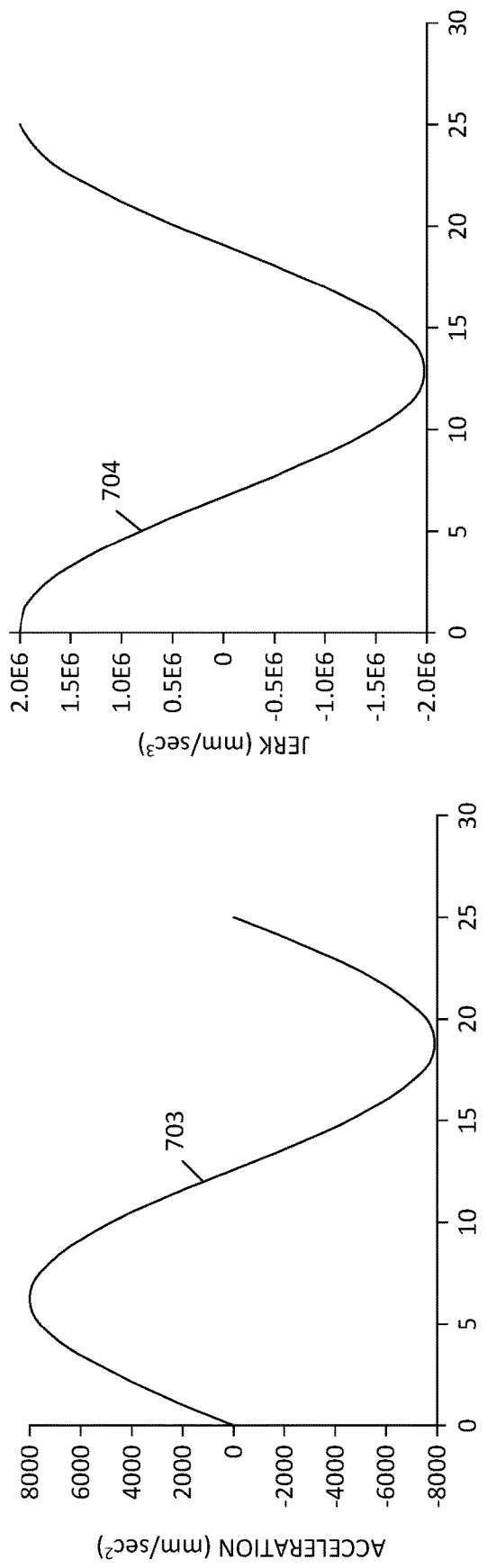
FIG. 7A
FIG. 7B
FIG. 7C
FIG. 7D

MODULATION OF SCANNING VELOCITY DURING OVERLAY METROLOGY

FIELD OF THE INVENTION

The present invention relates to an improved method and system for obtaining images of overlay targets on a wafer.

RELATED ART

FIG. 1A is a top view of a wafer 100 that includes a plurality of die (e.g., die 101 and 102) fabricated thereon. A plurality of overlay targets 110 are fabricated on the wafer 100, wherein these overlay targets 110 are typically formed in the streets located between the die. The overlay targets 110 are sparsely populated across wafer 100 and there are typically no constraints on the layout of the overlay targets 110. FIG. 1B is an expanded top view of region 120, which illustrates the street 130 between die 101 and 102, including adjacent overlay targets 121 and 122. In the illustrated example, each of the overlay targets 121 and 122 has a layout area of 35 microns×35 microns, and the overlay targets 121-122 are separated by a distance of 2 mm. In general, each overlay target includes a pattern of structures fabricated in one or more layers in accordance with the semiconductor process used to fabricate the die on wafer 100. Images of the overlay targets 110 are obtained and analyzed to measure errors that may exist in the fabrication process across the wafer 100. In the illustrated example, overlay target 121 is located closer to die 101, and overlay target 122 is located closer to die 102, such that these overlay targets 121 and 122 are not aligned along the main axis of the street 130. In addition, the spacing between overlay targets 110 is not consistent.

In accordance with one conventional method, an overlay metrology system operates in a move and measure (MAM) mode, wherein the wafer 100 is mounted on a movable stage, and the stage is moved relative to the objective lens of a microscope to position a single overlay target (e.g., overlay target 121) within the field of view of the objective lens. To obtain a clear image of the overlay target, the wafer 100 must be stationary. However, moving the wafer 100 on the stage introduces vibrations to the system. A waiting period must therefore exist to allow for these system vibrations to settle prior to obtaining an image of the overlay target. After the overlay target image is obtained, the stage is moved such that the adjacent overlay target on the wafer 100 (e.g., overlay target 122) is located in the field of view of the objective lens. The system again waits for any vibrations (caused by the moving stage) to settle, and an image of the next overlay target is then obtained. This process is repeated for each of the overlay targets 110 on the wafer 100.

The process of accelerating the stage from a full stop, decelerating the stage to the next full stop, and then waiting for the resulting system vibrations to settle is time consuming and limits the overall process throughput. Note that increasing the acceleration/deceleration of the stage will reduce the time required to move between adjacent overlay targets, but will increase the associated system vibrations, undesirably increasing the required waiting period for the vibrations to settle. Because there are many overlay targets 110 separated by a significant pitch on the wafer 100, the time required to move the wafer 100 between each of the overlay targets 110 and then allow the system to settle in accordance with the move and measure method represents significant overhead.

FIG. 2A is a diagram of an optical head 200 of a microscope used for the collection of moving overlay target images. Optical head 200 includes illumination fibers 201-202, which illuminate the wafer 100 from oblique angles, as illustrated. Light diffracted from the wafer (e.g., from the overlay targets 110) is imaged onto a time delay integration (TDI) sensor 220, through an objective lens 210. The wafer 100 is mounted on wafer stage 250, which moves the wafer 100 with respect to the optical head 200. Wafer stage 250 is moved in response to controls received from constant velocity controller 260. As described in more detail below, TDI sensor 220 enables the capture of images from the overlay targets 110 while the wafer 100 is in motion.

FIG. 2B illustrates the general operation of TDI sensor 220. Controller 260 moves the wafer 100 (and therefore the overlay target 121) at a continuous, constant velocity with respect to the TDI sensor 220, wherein the relative motion between the wafer 100 and the optical head 200 is represented by arrow 215. During time period T=1, light diffracted from a first section 121a of overlay target 121 is directed through objective lens 210 (not shown in FIG. 2B) to a first row of sensor pixel elements 2201 of TDI sensor 220. Each of the sensor pixel elements 2201 stores a charge proportional to the received light.

During time period T=2, the charges stored in the first row of sensor pixel elements 2201 are shifted into a second row of sensor pixel elements 2202 of TDI sensor 220 (as illustrated by arrow 231). In a synchronized manner, the movement of overlay target 122 results in the light diffracted from the first section 121a of overlay target 121 being directed through objective lens 210 to the second row of sensor pixel elements 2202. At this time, the image of the first section 121a of overlay target 121 is further developed in the second row of sensor pixel elements 2202 (i.e., each of the sensor pixel elements 2202 stores additional charge proportional to the light received during time period T=2). This process is repeated until first section 121a of overlay target 121 has been aligned with the last row of pixel sensor elements $220_5$. At this time, the contents of the last row of pixel sensor elements $220_5$ are read out (e.g., in a serial manner), thereby providing an image of the first section 121a of overlay target 121. Because the image of the first section 121a is collected over a plurality time periods, the intensity of the light provided by illumination fibers 201-202 does not need to be excessively high.

TDI sensor 220 is able to image multiple sections of overlay target 121 in parallel. For example, during time period T=2, after the charges stored in the first row of sensor pixel elements 2201 have been shifted into the second row of sensor pixel elements 2202, the charges stored in the first row of pixel elements 2201 are reset. Also during time period T=2, light diffracted from a second section 121b of overlay target 121 is directed through objective lens 210 to the first row of sensor pixel elements 2201. In response, each of the sensor pixel elements 2201 stores a charge proportional to the light received from the second section 121b of overlay target. The image of the second section 121b of the overlay target 121 is thereby developed in parallel with (and one time period behind) the image of the first section 121a of the overlay target 121.

Controller 260 moves wafer stage 250 at a constant velocity, which is limited by the maximum velocity at which TDI sensor 220 can reliably obtain images of the overlay targets 110. Moving wafer stage 250 at a constant velocity eliminates system vibrations due to accelerating and decelerating the wafer stage 250. However, maintaining the constant velocity of the wafer stage 250 while moving the wafer 100 the relatively long distances between adjacent overlay targets 110 may undesirably reduce process throughput. Stated another way, the maximum scan velocity of the TDI sensor 220 may undesirably limit the speed at which the overlay targets 110 are scanned.

Thus, when using the above-described conventional methods to image the overlay targets 110, system throughput is limited, especially for high-magnification microscope-based industrial systems that have extreme stability and image quality requirements. It would therefore be desirable to have an improved method and system for minimizing the time required to obtain clear images of overlay targets on a wafer.

SUMMARY

Accordingly, the present invention provides a method for obtaining images of overlay targets on a wafer including (1) using a sensor to acquire images of overlay targets on a wafer while the wafer is in motion and (2) accelerating and decelerating the wafer to move the overlay targets into alignment with the sensor between acquiring images of adjacent overlay targets. In one embodiment, the sensor is a TDI sensor, although any sensor capable of acquiring images of moving overlay targets may be used in other embodiments.

In one variation of step (1), a constant velocity is maintained between the wafer and the sensor while the sensor is acquiring images of the overlay targets. In another variation of step (1), a variable velocity exists between the wafer and the sensor while the sensor is acquiring images of the overlay targets. In both variations, a predetermined velocity exists between the wafer and the sensor at both the beginning and the end of the overlay target image acquisition.

Various methods can be used to accelerate/decelerate the wafer between adjacent overlay targets in accordance with step (2). In a first embodiment, the wafer is accelerated at a maximum acceleration for a first time period, and then the wafer is decelerated at a maximum deceleration for a second time period. The velocity of the wafer increases linearly during the first time period and decreases linearly during the second time period. The velocity is modulated such that the wafer exhibits a minimum velocity at the start of the acceleration and the end of the deceleration. This minimum velocity is appropriate for scanning the overlay images with the sensor. The first embodiment results in rapid movement of the wafer between adjacent overlay targets, but introduces significant vibrational forces due to a large jerk impulse associated with the acceleration/deceleration profile.

In a second embodiment, the wafer is accelerated and decelerated between adjacent overlay targets by: linearly accelerating the wafer, then linearly decelerating the wafer, and then linearly accelerating the wafer, wherein the wafer is accelerated/decelerated in a triangular waveform pattern. The velocity of the wafer gradually increases and then gradually decreases in response to the triangular acceleration pattern. The velocity is modulated such that the wafer exhibits a minimum velocity at the start and end of the triangular acceleration pattern. The second embodiment may result in slower movement of the wafer between adjacent overlay targets, when compared with the first embodiment. However, the second embodiment will typically exhibit significantly lower vibrational forces than the first embodiment, due to a finite jerk associated with the triangular acceleration pattern.

In a third embodiment, the wafer is accelerated and decelerated between adjacent overlay targets using a sinusoidal acceleration pattern. The sinusoidal acceleration pattern ensures a sinusoidal velocity pattern and a sinusoidal jerk pattern. The sinusoidal acceleration pattern completes exactly one cycle to move the wafer between adjacent overlay targets. The sinusoidal acceleration pattern also results in a frequency of velocity modulation, wherein exactly one full cycle of velocity modulation is completed to move the wafer between adjacent overlay targets (and the wafer exhibits a minimum velocity at the start and end of the sinusoidal acceleration pattern). The third embodiment may result in slower movement of the wafer between adjacent overlay targets, when compared with the second embodiment. However, the third embodiment will typically result in significantly lower vibrational forces than the second embodiment. More specifically, the third embodiment results in a single-frequency vibration harmonic, which is associated with the frequency of the sinusoidal acceleration pattern.

In a fourth embodiment, the wafer is accelerated and decelerated between adjacent overlay targets by accelerating and decelerating the wafer along a trajectory composed of two or more sinusoidal velocity modulations, wherein the frequencies of the sinusoidal velocity modulations are set so that integral full cycles of velocity modulation are completed to move the wafer between adjacent overlay targets. In one example, the two or more sinusoidal velocity modulations include a pure sinusoidal velocity modulation and a harmonic of the pure sinusoidal velocity modulation. The fourth embodiment may result in faster movement of the wafer between adjacent overlay targets, when compared with the third embodiment. However, the fourth embodiment typically results in higher vibrational forces than the third embodiment. More specifically, the fourth embodiment results in multiple-frequency vibration harmonics, wherein the number of vibration harmonics is associated with the number of sinusoidal velocity modulations used.

The present invention also includes a system for imaging overlay targets on a wafer, wherein the system includes a sensor for acquiring images of overlay targets on a wafer while the wafer is in motion, and a controller for accelerating and decelerating the wafer to move the overlay targets into alignment with the sensor between acquiring images of the overlay targets.

In accordance with another aspect of the present invention, adjacent overlay targets are located with a constant spacing a street between adjacent die. In another aspect of the present invention, overlay targets located in a street between adjacent die are aligned in a straight line.

The present invention will be more fully understood in view of the following description and drawings.

BRIEF DESCRIPTION OF THE DRAWINGS

FIG. 1A is a top view of a conventional wafer, including overlay targets located in streets between die fabricated on the wafer.

FIG. 1B is an expanded portion of FIG. 1A, showing exemplary spacing between overlay targets on the wafer of FIG. 1A.

FIGS. 5A, 5B, 5C and 5D are graphs that illustrate the distance traveled by a stage between overlay targets, the velocity of the stage between overlay targets, the acceleration of the stage between overlay targets and the jerk of the stage between overlay targets, respectively, in accordance with a second embodiment of the present invention that implements a triangular acceleration profile.

FIGS. 6A, 6B, 6C and 6D are graphs that illustrate the distance traveled by a stage between overlay targets, the velocity of the stage between overlay targets, the acceleration of the stage between overlay targets and the jerk of the stage between overlay targets, respectively, in accordance with a third embodiment of the present invention that implements a sinusoidal acceleration profile.

FIGS. 7A, 7B, 7C and 7D are graphs that illustrate the distance traveled by a stage between overlay targets, the velocity of the stage between overlay targets, the acceleration of the stage between overlay targets and the jerk of the stage between overlay targets, respectively, in accordance with a variation of the third embodiment of the present invention.

DETAILED DESCRIPTION

Figure 2A:
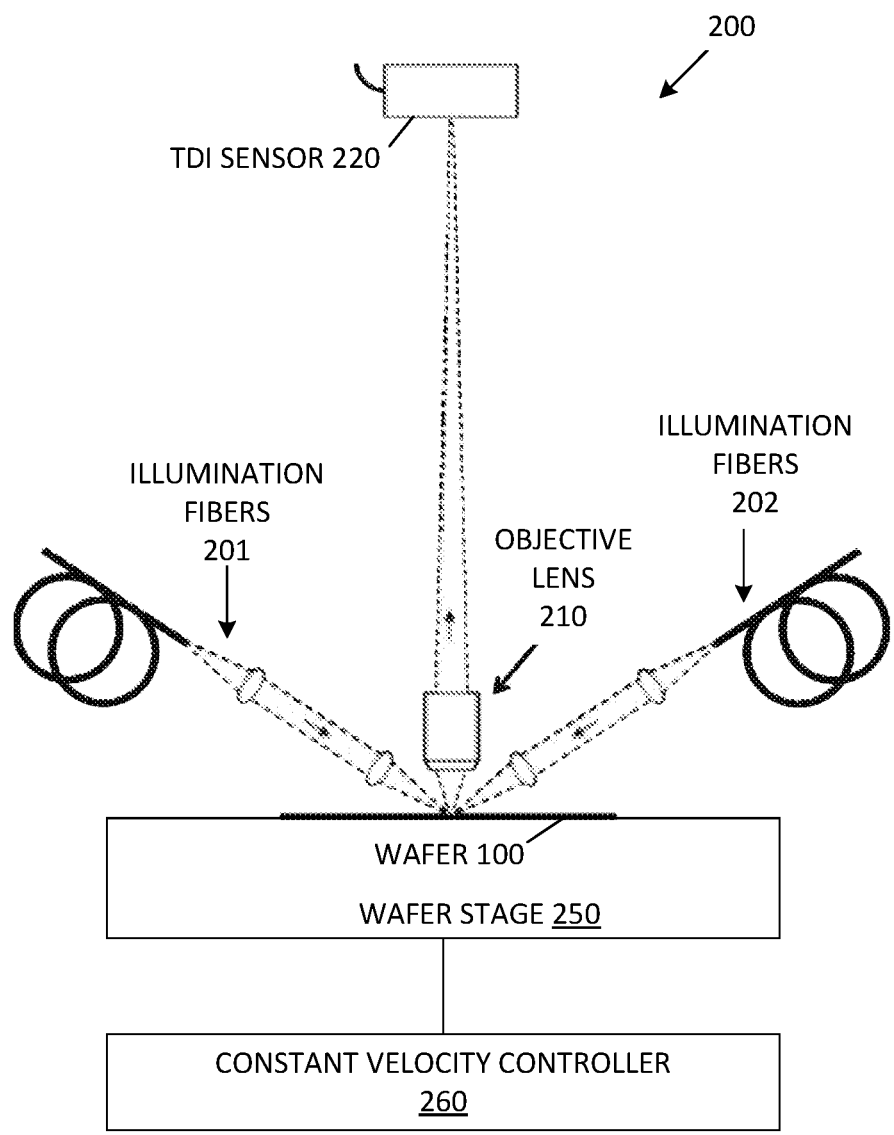
FIG. 2A is a diagram illustrating a system including a conventional optical head for collecting images of moving overlay targets using a time delay integration (TDI) sensor.
Figure 2B:
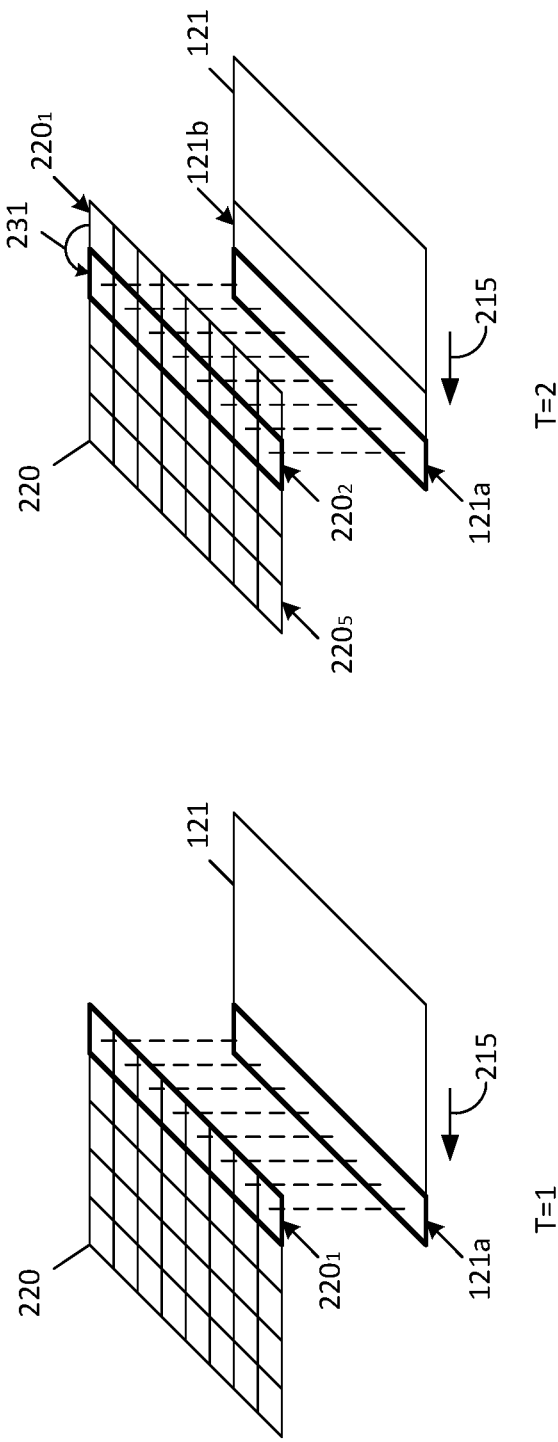
FIG. 2B is a diagram illustrating the general operation of the conventional TDI sensor of FIG. 2B.

In general, the present invention provides an improved method and structure for reducing the required measurement time of a plurality of overlay targets on a wafer. In one embodiment, a TDI sensor is used to obtain a target image of an overlay target on a wafer while the wafer stage is being moved at or near a minimum velocity. During acquisition of the image of an overlay target, the transfer of charge between rows of the TDI sensor is synchronized with the motion of the overlay target. Synchronizing the motion of the overlay target with the transfer of charge in the TDI sensor minimizes motion blur in the captured target image. After the TDI sensor has acquired an overlay target image, the wafer stage is accelerated to a higher peak velocity, and is then decelerated back to (or near) the minimum velocity upon reaching the adjacent overlay target. Because the wafer stage is moving faster than the minimum velocity during the acceleration/deceleration phase, this phase is referred to as a high-velocity phase of the scan. The TDI camera circuit re-establishes synchronization of the TDI sensor and the wafer motion before the adjacent overlay target becomes visible.

The TDI sensor obtains the target image of the adjacent overlay target while the wafer stage is being moved at or near the minimum velocity. In one embodiment, the minimum velocity is a constant velocity. In another embodiment, the velocity may be changing slightly during the acquisition of the overlay target image.

In one embodiment, the TDI sensor does not acquire images during the high-velocity phase of the scan. In another embodiment, the TDI sensor acquires images at full resolution during the high-velocity phase of the scan. In yet another embodiment, the TDI sensor uses faster scanning modes, such as pixel binning with reduced resolution, during the high-velocity phase of the scan. The TDI data obtained in the high-velocity phase can be used to assist with focus, alignment, and calibration, before the overlay target image is collected by the TDI sensor.

Accelerating/decelerating the wafer stage between adjacent overlay targets advantageously minimizes the time required to image the overlay targets. Because the wafer stage is not required to be motionless during the image acquisition phase (but is moved at or near the minimum velocity), there is no settling time required before obtaining the overlay target images.

In different embodiments, the wafer stage can be accelerated/decelerated in various manners between obtaining the overlay target images. In one embodiment, the wafer stage is accelerated at a constant maximum acceleration for a first time period (e.g., until the wafer stage reaches a location about halfway to the adjacent overlay target), and is then decelerated at a constant maximum deceleration for a second time period (e.g., until the wafer stage reaches the adjacent overlay target). In another embodiment, the wafer stage is moved in accordance with a triangular acceleration profile, wherein the jerk is limited to a predetermined maximum. In another embodiment, the wafer stage is moved in accordance with a sinusoidal acceleration profile, wherein the jerk is limited to a predetermined maximum, and wherein the frequency of velocity modulation is selected so that exactly one full cycle of velocity modulation is completed during the move between adjacent overlay targets. In this case, the induced vibration of the system is limited to a single frequency, which allows for much better compensation and feed-forward correction, resulting in improved measurement accuracy compared to the prior art, at a given fundamental measurement frequency. In another embodiment, the wafer stage is moved using a near-sinusoidal acceleration profile, wherein the jerk is limited to a predetermined maximum. In this embodiment, the trajectory of the wafer stage is composed of two or more sinusoidal velocity modulations where the frequencies of the sinusoids are selected so that integral full cycles of velocity modulation are completed during the move between adjacent overlay targets. This case results in a higher frequency, but still manageable, induced vibration, which allows for ultra-precise calibration and corrections to occur. It provides a solution with reduced stage acceleration requirements for comparable measurement rates.

The present invention will now be described in more detail. In the embodiments described below, overlay targets are located in streets between die on a wafer, wherein the overlay targets located in a street are aligned along a straight line with a known, constant pitch between adjacent overlay targets. This advantageously allows for a cyclic acceleration and deceleration of the wafer while moving successive overlay targets into alignment with the TDI sensor. In accordance with one variation, it is not necessary to include an overlay target at each constant pitch location. That is, overlay targets may be absent at some of the constant pitch locations. For example, overlay targets may not be present in locations where horizontal and vertical streets intersect. In accordance with one embodiment, the overlay targets are located along a straight line on the wafer, wherein the overlay targets are separated by integral multiples of a single pitch (e.g., some overlay targets may be separated by 1× pitch, while other overlay targets may be separated by 2× pitch).

Figure 3A:
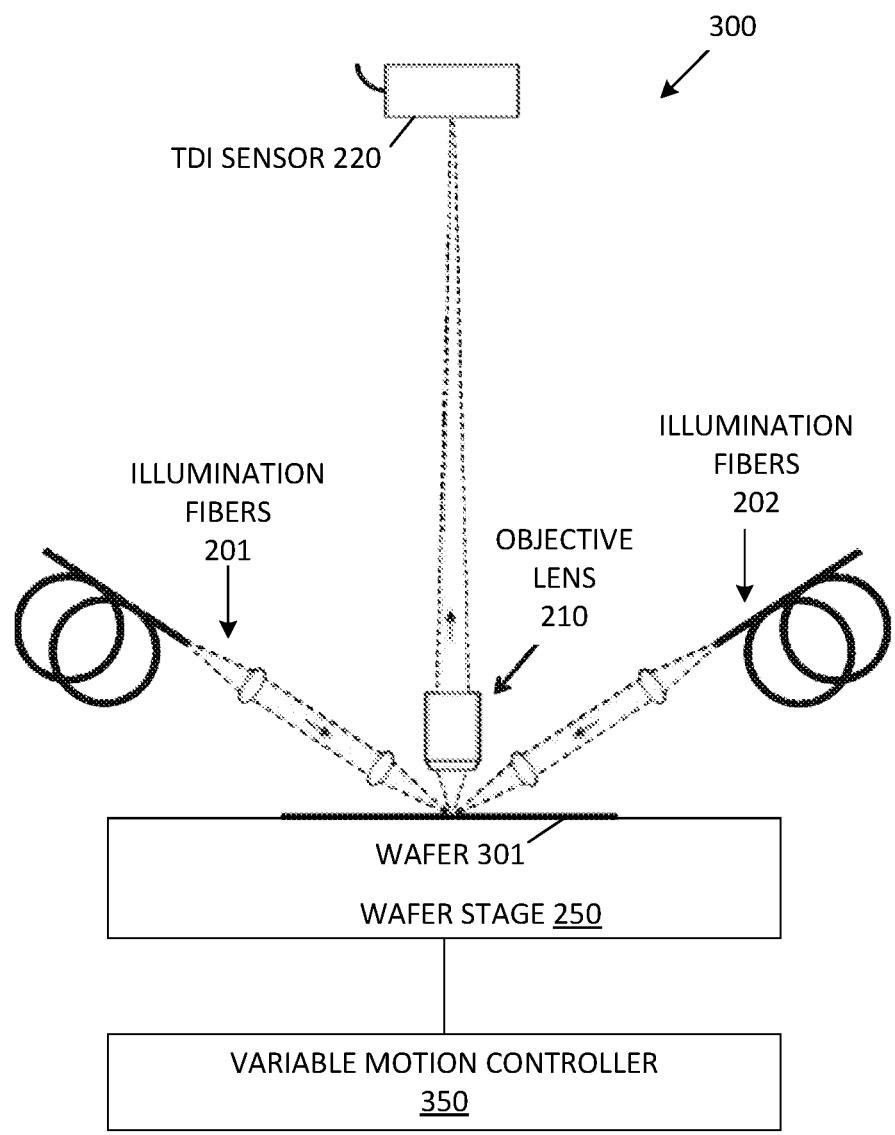
FIG. 3A is a diagram of a system for imaging overlay targets on a wafer, which includes a TDI sensor and a variable motion controller in accordance with one embodiment of the present invention.

FIG. 3A is a diagram of a system 300 in accordance with one embodiment of the present invention. Similar elements in FIGS. 1A-1B, 2A-2B and FIG. 3 are labeled with similar reference numbers. Thus, system 300 includes illumination fibers 201-202, objective lens 210 and TDI sensor 220, which have been described above in connection with FIGS. 1A-1B and 2A-2B. In addition, system 300 includes wafer 301 and variable motion controller 350, which controls the motion of wafer stage 250 in manners described in more detail below. The magnitudes and rates of increases and decreases in the velocity of stage 250 between acquisitions of overlay target images are limited by the capabilities of the controller 350 and wafer stage 250. For example, the maximum acceleration and deceleration of the stage 250 may be limited, for example, to 9.81 m/sec$^2$ or 19.62 m/sec$^2$. Similarly, the maximum jerk of the stage 250 may be limited to 1000 m/sec$^3$ or 2000 m/sec$^3$. In general, controller 350 applies forces that causes stage 250 to accelerate and decelerate between the acquisition of adjacent overlay target images. Various embodiments for operating variable motion controller 350 and stage 250 are described in more detail below.

Figure 3B:
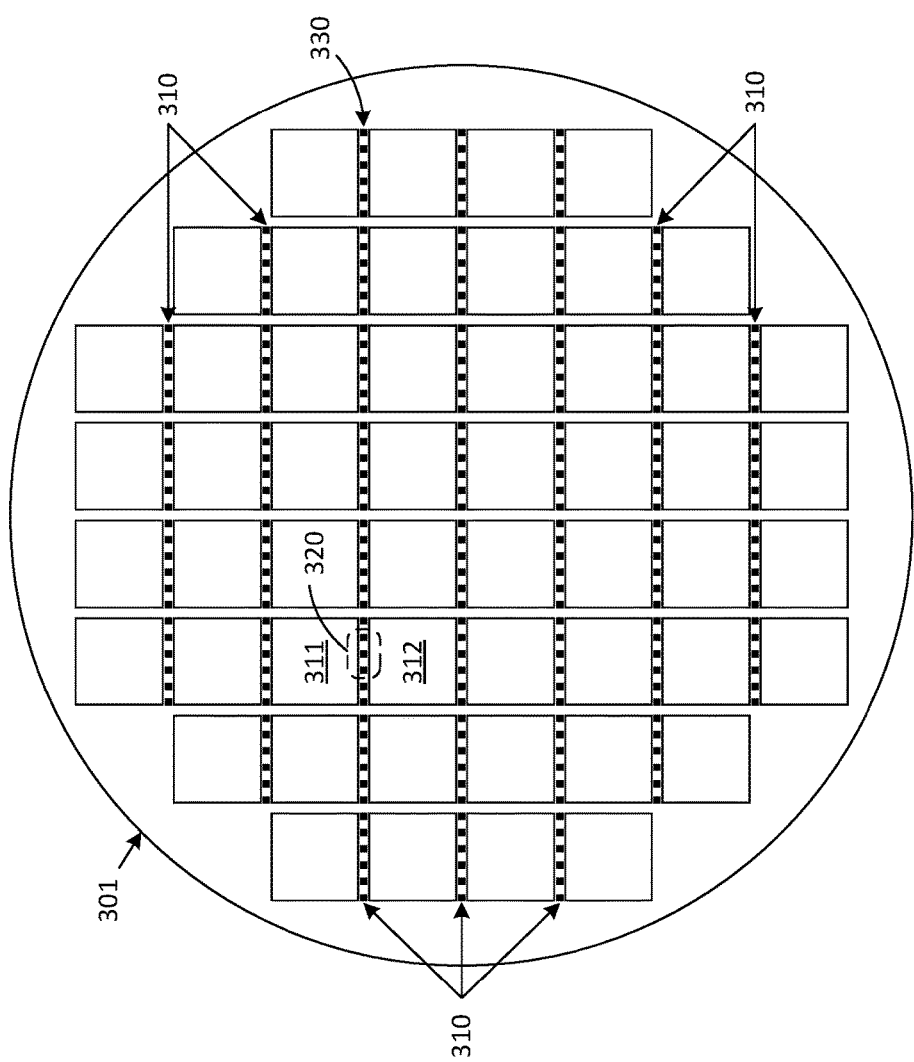
FIG. 3B is a top view of a wafer in accordance with one embodiment of the present invention, wherein overlay targets are periodically spaced along straight lines within streets between die fabrication on the wafer.

FIG. 3B is a top view of wafer 301 in accordance with one embodiment of the present invention. A plurality of die (e.g., die 311 and 312) are fabricated on wafer 301. A plurality of overlay targets 310 are fabricated on the wafer 301, in the streets located between the die (e.g., street 330).

Figure 3C:
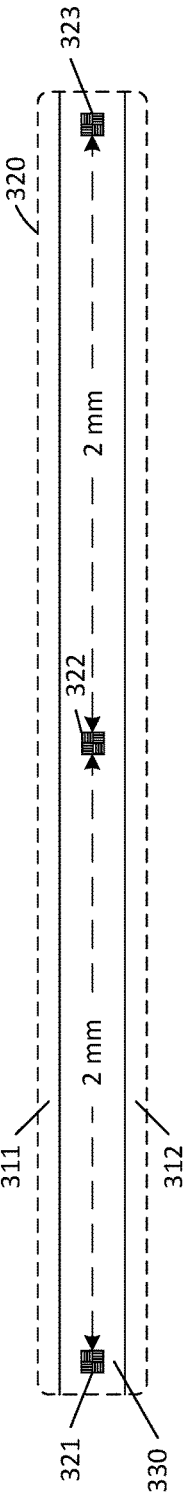
FIG. 3C is an expanded portion of FIG. 3B, showing exemplary spacing between overlay targets on the wafer of FIG. 3B.

FIG. 3C is an expanded top view of region 320, which illustrates a portion of the street 330 between die 311 and 312, including adjacent overlay targets 321, 322 and 323. In the illustrated example, each of the overlay targets 321-323 has a layout area of 35 microns×35 microns, and adjacent overlay targets are separated by a distance of 2 mm. In one embodiment, periodic spacing exists between adjacent overlay targets in the portion of the street 330 between die 311 and 312 (i.e., all overlay targets in the portion of the street 330 located between die 311 and 312 are separated by 2 mm). In another embodiment, periodic spacing exists between all adjacent overlay targets along the entire length of the street 330 (i.e., all overlay targets in street 330 are separated by 2 mm). In the illustrated example, overlay targets 321-323 are located along a straight line within street 330, such that moving wafer 301 along a single line or axis will successively bring all of the overlay targets 321-323 into the field of view of the TDI sensor 220. In one embodiment, a straight line exists between overlay targets in the portion of the street 330 between die 311 and 312 (i.e., all overlay targets in the portion of the street 330 located between die 311 and 312 are located along a single straight line). In another embodiment, all overlay targets along the entire length of the street 330 are located along a single straight line.

The manner in which controller 350 moves the stage 250 and wafer 301 in accordance with various embodiments will now be described in more detail. In each of the embodiments described below, the wafer 301 is moved in a cyclic pattern, such that successive overlay targets 310 in a particular street are moved into the field of view of the TDI sensor 220.

In a first embodiment, controller 350 controls stage 250 to have a constant velocity while TDI sensor 220 acquires images of overlay targets 310 on wafer 301. After acquiring an image of an overlay target, controller 350 accelerates the stage 250 (at a maximum acceleration) until reaching the halfway distance to the adjacent overlay target, and then decelerates the stage 250 (at a maximum deceleration) until reaching the adjacent overlay target (i.e., until the adjacent overlay target enters the field of view of the TDI sensor 220).

Figure 4A:
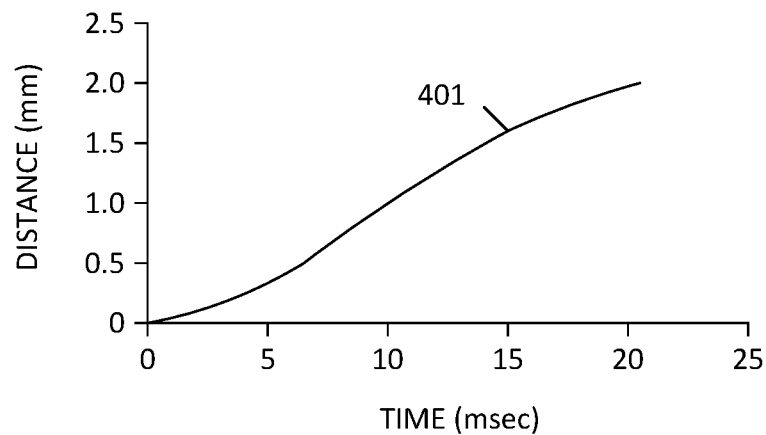
FIGS. 4A, 4B and 4C are graphs that illustrate the distance traveled by a stage between overlay targets, the velocity of the stage between overlay targets and the acceleration of the stage between overlay targets, respectively, in accordance with a first embodiment of the present invention.
Figure 4B:
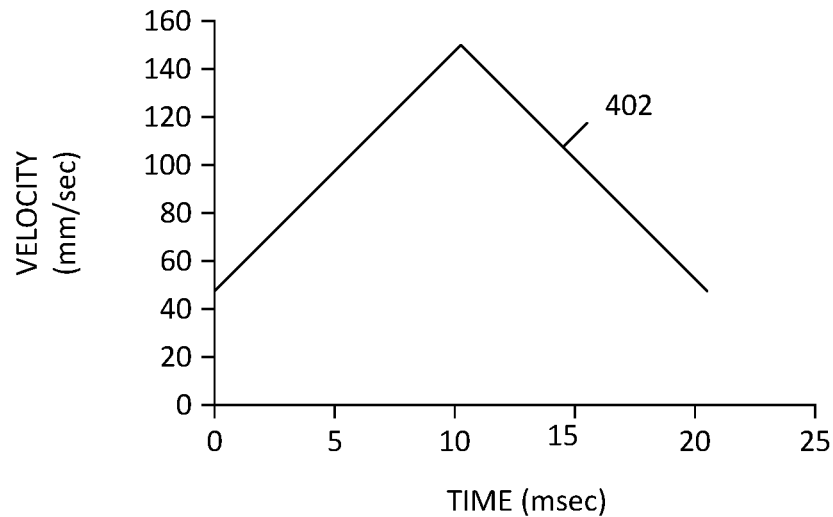
Figure 4C:
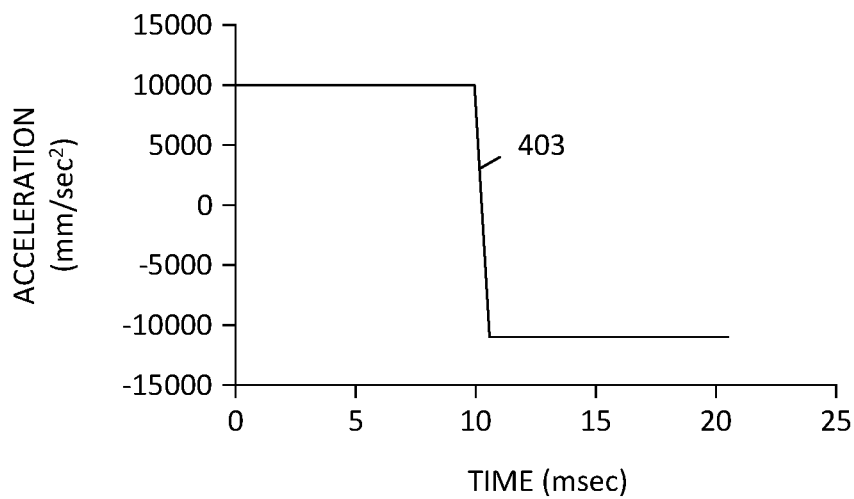

FIGS. 4A, 4B and 4C are graphs that illustrate the distance traveled by stage 250 between adjacent overlay targets, the velocity of stage 250 between adjacent overlay targets and the acceleration of stage 250 between adjacent overlay targets, respectively, in accordance with the first embodiment. In the illustrated example, adjacent overlay targets are separated by a distance of 2 mm (as illustrated by FIG. 3C), and the maximum acceleration of stage 250 is limited to 9.81 m/sec$^2$.

During the acquisition of images of the overlay targets, the velocity of stage 250 is controlled to have a constant (minimum) velocity of 48 mm/sec. As illustrated by the velocity profile 402 of FIG. 4B, the acquisition of an overlay target image is completed at time=0 msec, wherein the velocity of stage 250 is 48 mm/sec. As illustrated by the acceleration profile 403 of FIG. 4C, starting at time=0 msec, controller 350 accelerates stage 250 at the maximum acceleration of 9.81 m/sec$^2$. The stage 250 is accelerated for a first time period of about 10.25 msec, wherein the stage 250 reaches the halfway distance (1 mm) to the adjacent overlay target. Controller 350 then decelerates stage 250 at the maximum deceleration of −9.81 m/sec$^2$. The stage is decelerated for a second time period of about 10.25 msec, wherein the stage 250 reaches the adjacent overlay target.

As illustrated by FIG. 4B, the velocity of stage 250 linearly increases from 48 mm/sec to a maximum of about 150 mm/sec (at the halfway distance to the adjacent overlay target). The velocity of stage 250 then linearly decreases from the maximum velocity to the minimum velocity of 48 mm/sec. As illustrated by FIGS. 4A and 4B, when the stage 250 reaches the adjacent overlay target (at 2 mm), the velocity of the stage 250 is at the minimum velocity of 48 mm/sec. The velocity of stage 250 is maintained at the minimum velocity of 48 mm/sec during the acquisition of the image of the adjacent overlay target. This process is repeated for successive overlay targets.

As illustrated by the distance profile 401 of FIG. 4A, it takes stage 250 about 20.5 msec to move 2 mm between overlay targets. This is significantly faster than a conventional move and measure (MAM) method or a conventional TDI sensor method that moves the stage 250 at a constant velocity during both image acquisition and movement between adjacent overlay targets.

Note, however, that the large and sudden change in acceleration of the stage 250 (FIG. 4C, time=10.25 msec) produces mechanical forces (F=ma) and vibrations at a wide range of frequencies, and these vibrations can limit the image quality and measurement accuracy provided by TDI sensor 220. The additional embodiments described below provide for further optimization and improved performance with respect to the method of the first embodiment.

In accordance with a second embodiment, the maximum jerk (or rate of change of acceleration) of the stage 250 is limited to a predetermined maximum. For example, the jerk of stage 250 may be limited 1,000 m/sec$^3$ or 2,000 m/sec$^3$. When moving between overlay targets, controller 350 linearly accelerates the stage 250 (at a maximum jerk), then linearly decelerates the stage 250 (again at the maximum jerk), and then linearly accelerates the stage 250 (at the maximum jerk).

FIGS. 5A, 5B, 5C and 5D are graphs that illustrate the distance traveled by stage 250 between overlay targets, the velocity of stage 250 between overlay targets, the acceleration of stage 250 between overlay targets and the jerk of stage 250 between overlay targets, respectively, in accordance with one example of the second embodiment. In this example, adjacent overlay targets are separated by a distance of 2 mm as illustrated by the distance profile 501 FIG. 5A, and the maximum jerk of stage 250 is limited to 1,000 m/sec$^3$ as illustrated by the jerk profile 504 of FIG. 5D.

As illustrated by the triangular acceleration profile 503 of FIG. 5C and the jerk profile 504 of FIG. 5D, starting at time=0, controller 350 linearly accelerates stage 250 at the maximum jerk of 1,000 m/sec$^3$. When the stage 250 is about one-quarter of the distance to the adjacent overlay target (at time ~7 msec), controller 350 linearly decelerates stage 250 at the maximum jerk of –1,000 m/sec$^3$. When stage 250 reaches about three-quarters of the distance to the adjacent overlay targets (time ~21 msec), controller 350 linearly accelerates the stage 250 at the maximum jerk of 1,000 m/sec$^3$. Thus, as illustrated by the acceleration profile 503 of FIG. 5C, the acceleration of stage 250 follows a triangular wave shape.

As illustrated by the distance profile 501 of FIG. 5A and the velocity profile 502 of FIG. 5B, the stage 250 is moving at a minimum velocity of 48 mm/sec at the beginning (distance=0 mm) and the end (distance=2 mm) of the move between adjacent overlay targets. The velocity of stage 250 increases from the minimum velocity of 48 mm/sec (at distance=0 mm) to a maximum velocity of about 96 mm/sec (near the halfway distance of 1 mm). As illustrated by the distance profile 501 of FIG. 5A, stage 250 requires about 27.5 msec to move 2 mm between overlay targets in the illustrated example.

In one variation of the second embodiment, controller 350 controls stage 250 to maintain the minimum constant velocity of 48 mm/sec during the scanning acquisition of target overlay images by TDI sensor 220.

Figure 5E:
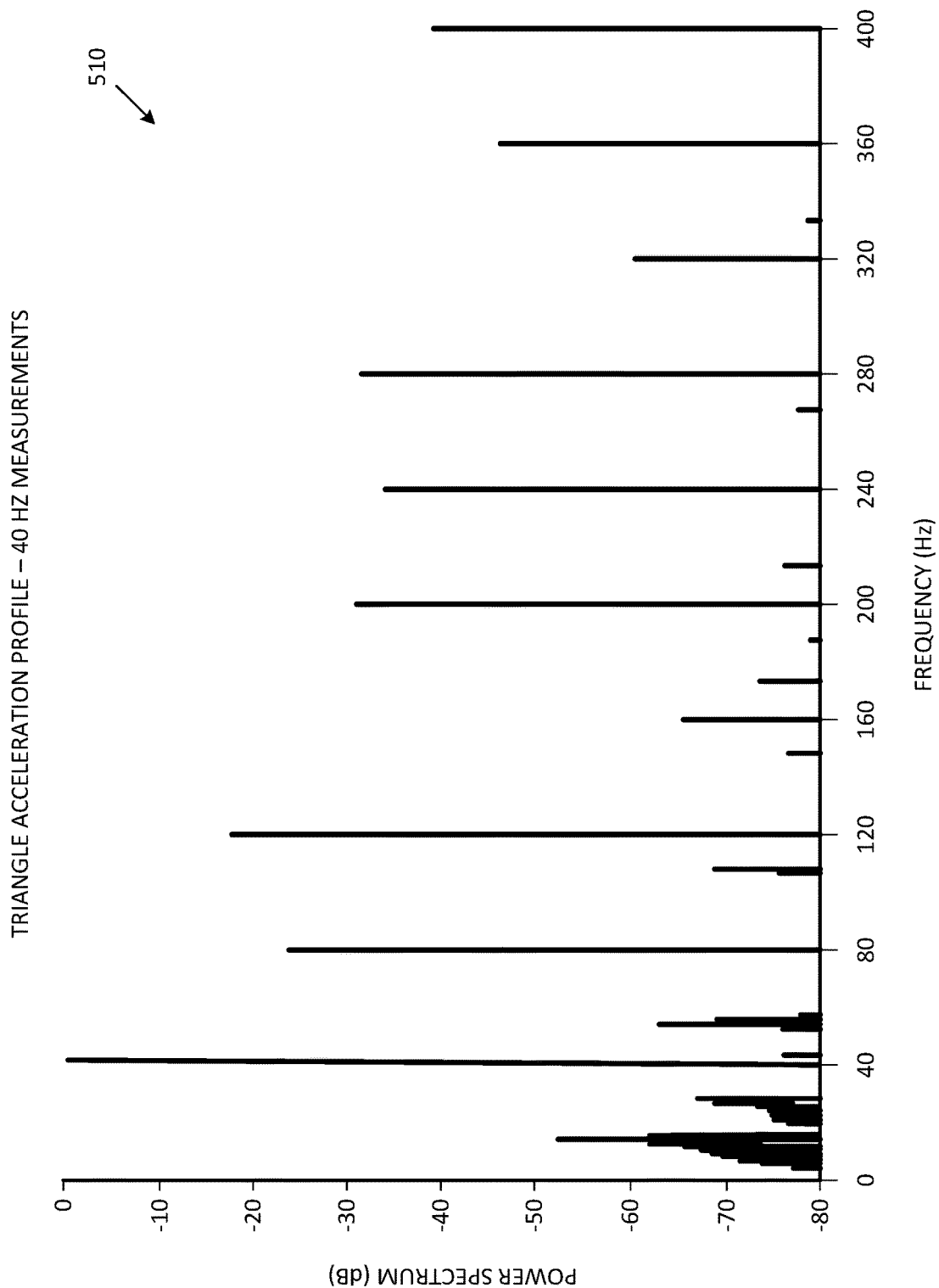
FIG. 5E is a graph illustrating a vibrational forces frequency spectrum for a system that implements a triangular acceleration profile in accordance with the second embodiment of the present invention.

The triangle wave acceleration profile 503 of FIG. 5C significantly reduces the high frequency harmonics of the vibration spectrum introduced to the system when compared with the discontinuous step function acceleration profile 403 of FIG. 4C. Nevertheless, high frequency harmonics are still produced in the second embodiment of FIGS. 5A-5D. FIG. 5E is a graph 510 illustrating the vibrational forces frequency spectrum for a system that implements a triangular acceleration profile that is similar to the triangle acceleration profile 503 of FIGS. 5A-5D, operating at a 40 Hz measurement rate (with a brief image acquisition time at the minimum constant velocity). The graph of FIG. 5E shows the vibration harmonics generated up to 400 Hz.

In accordance with a third embodiment, controller 350 programs the velocity of stage 250 to follow a purely sinusoidal trajectory. In this embodiment, the jerk, acceleration and position trajectories of stage will also follow sinusoidal trajectories. The minimum of the velocity modulation is set to match the velocity required during scanning acquisition of target images. The maximum of the velocity modulation is limited by the maximum acceleration or maximum jerk capabilities of the stage 250. The periodicity of the sinusoidal modulations are set to match the spacing between overlay targets on the wafer 100.

FIGS. 6A, 6B, 6C and 6D are graphs that illustrate the distance traveled by stage 250 between overlay targets, the velocity of stage 250 between overlay targets, the acceleration of stage 250 between overlay targets, and the jerk of stage 250 between overlay targets, respectively, in accordance with one example of the third embodiment. In this example, adjacent overlay targets are separated by a distance of 2 mm as illustrated by the distance profile 601 of FIG. 6A, and the maximum jerk of stage 250 is limited to 1,000 m/sec$^3$ as illustrated by the jerk profile 604 of FIG. 6D.

As illustrated by the sinusoidal velocity profile 602 of FIG. 6B, a velocity of 48 mm/sec is maintained at the beginning and end of the move for scanning acquisition of the overlay target images. As illustrated by FIG. 6B, controller 350 causes the velocity of stage 250 to follow a sinusoidal pattern, increasing from a minimum velocity of 48 mm/sec at time=0 to a maximum velocity of about 90 mm/sec (near the halfway distance of 1 mm), and then decreasing back to the minimum velocity of 48 mm/sec upon reaching the adjacent overlay target (at distance=2 mm). Exactly one cycle of the sinusoidal velocity pattern 602 is completed as the stage 250 travels between adjacent overlay targets. As illustrated by FIGS. 6C and 6D, the sinusoidal velocity profile 602 advantageously results in a sinusoidal acceleration profile 603 and a sinusoidal jerk profile 604. The sinusoidal acceleration profile 603 of stage 250 increases from zero at time=0, and completes exactly one cycle of the sinusoidal pattern upon reaching the adjacent overlay target (at distance=2 mm). The sinusoidal jerk profile 604 of stage 250 decreases from a maximum jerk of 1000 m/sec$^3$ at time=0, and completes exactly one cycle of the sinusoidal pattern upon reaching the adjacent overlay target (at distance=2 mm). As illustrated by the sinusoidal distance profile 601 of FIG. 6A, it takes stage 250 about 29 msec to move 2 mm between overlay targets in the illustrated example. In accordance with one embodiment, a constant velocity of 48 mm/sec is maintained at the beginning and end of the move for scanning acquisition of overlay target images.

In one variation, a purely sinusoidal velocity trajectory is used (i.e., the velocity of stage 250 is not held constant at 48 mm/sec at the ends of the sinusoidal velocity cycles). In this variation, sinusoidal profiles 601-604 of FIGS. 6A-6D are slightly modified, such that the distance traveled during each sinusoidal velocity modulation is equal to the pitch between adjacent overlay targets. Under these conditions, the velocity of stage 250 reaches the minimum value of 48 mm/sec when an overlay target is centered under the TDI sensor 220. The velocity of the stage 250 is therefore not constant during the acquisition of the overlay target image by the TDI sensor 220 (as the velocity changes slightly near the minimum velocity of 48 mm/sec in accordance with the known sinusoidal pattern). In this case, the line clock rate of the TDI sensor 220 is modulated to match the instantaneous velocity of the stage 250 in order to prevent motion blur in the image acquired by the TDI sensor 220.

Figure 6E:
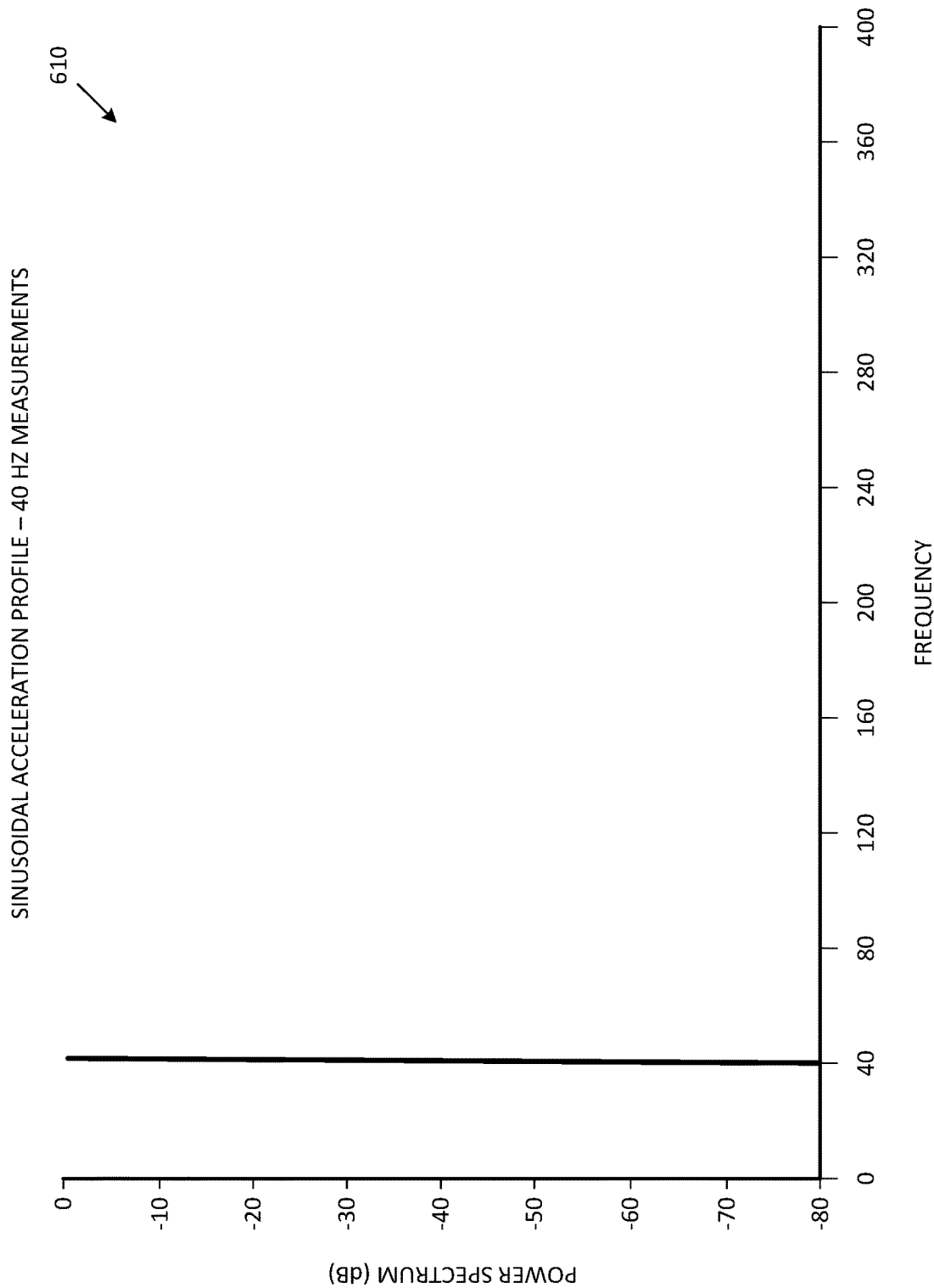
FIG. 6E is a graph illustrating the vibrational forces frequency spectrum for a system using a pure sinusoidal acceleration profile in accordance with the third embodiment of the present invention.

The sinusoidal acceleration profile 603 of the stage 250 significantly reduces the high frequency harmonics of the vibration spectrum introduced to the system with respect to the triangular acceleration profile 503 of FIG. 5C. FIG. 6E is a graph 610 illustrating the vibrational forces frequency spectrum for a system that implements a pure sinusoidal acceleration profile similar to the sinusoidal acceleration profile 603 of FIGS. 6A-6D, operating at a 40 Hz measurement rate. In this example, the single frequency sinusoidal acceleration profile results in a single vibration harmonic at a frequency of 40 Hz. The single frequency sinusoidal acceleration profile therefore results in greatly reduced vibration harmonics, with residuals primarily caused by non-linear control system and material responses. Single-frequency system errors are simple to correct using standard methods such as feed-forward compensation. In cases where the system exhibits one or more mechanical resonances that degrade performance, an operator can characterize the system in advance and reduce them in the design, or can choose to avoid those frequencies during normal operation. The ability to run under more stable and correctable conditions allows the stage 250 to operate at higher accelerations and higher levels of acceleration without destabilizing the system in ways that would prevent accurate images from being obtained.

FIGS. 7A, 7B, 7C and 7D are graphs that illustrate the distance traveled by stage 250 between overlay targets, the velocity of stage 250 between overlay targets, the acceleration of stage 250 between overlay targets and the jerk of stage 250 between overlay targets, respectively, in accordance with another example of the third embodiment. In this example, adjacent overlay targets are separated by a distance of 2 mm as illustrated by the sinusoidal distance profile 701 FIG. 7A, and the maximum jerk of stage 250 is limited to 2,000 m/sec$^3$ as illustrated by the sinusoidal jerk profile 704 of FIG. 7D. FIGS. 7B and 7C illustrate the sinusoidal velocity profile 702 and the sinusoidal acceleration profile 703, respectively. As illustrated by FIGS. 7A-7D, increasing the maximum jerk to 2,000 m/sec$^3$ advantageously allows the stage 250 to traverse the distance between adjacent overlay targets faster (e.g., in about 25 msec) than the embodiment of FIGS. 6A-6D, in which the maximum jerk is limited to 1,000 m/sec$^3$.

In accordance with a fourth embodiment, controller 350 programs the trajectory of stage 250 to be composed of two or more frequencies with relative phases chosen to reduce the peak acceleration required to move between overlay targets, while still limiting the range of frequencies of vibration injected into the system. For example, acceleration and deceleration of the motion of the stage 250 can occur along a trajectory composed of two or more sinusoidal velocity modulations, where the frequencies of the sinusoids are each set so that integral full cycles of velocity modulation are completed during moves between adjacent overlay targets. In accordance with the embodiments described above, the minimum velocity of the velocity modulation is set to match the velocity at which the TDI sensor 220 acquires the overlay target images. In one variation, one or more controlled harmonics (of selected phase and amplitude) are added to a single frequency sinusoidal wave.

Figure 8A:
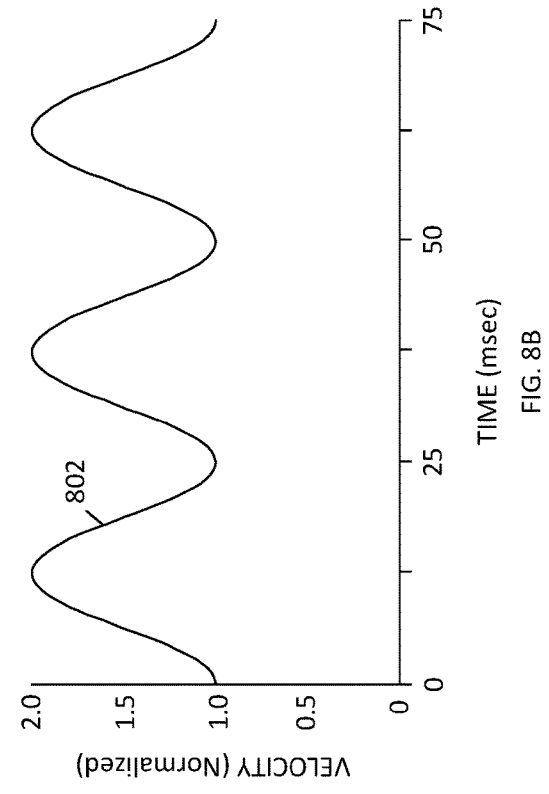
FIGS. 8A, 8B, 8C and 8D are graphs that illustrate the distance traveled by a stage between overlay targets, the velocity of the stage between overlay targets, the acceleration of the stage between overlay targets and the jerk of the stage between overlay targets, respectively, in accordance with a fourth embodiment of the present invention that implements a dual-frequency sinusoidal velocity profile.
Figure 8C:
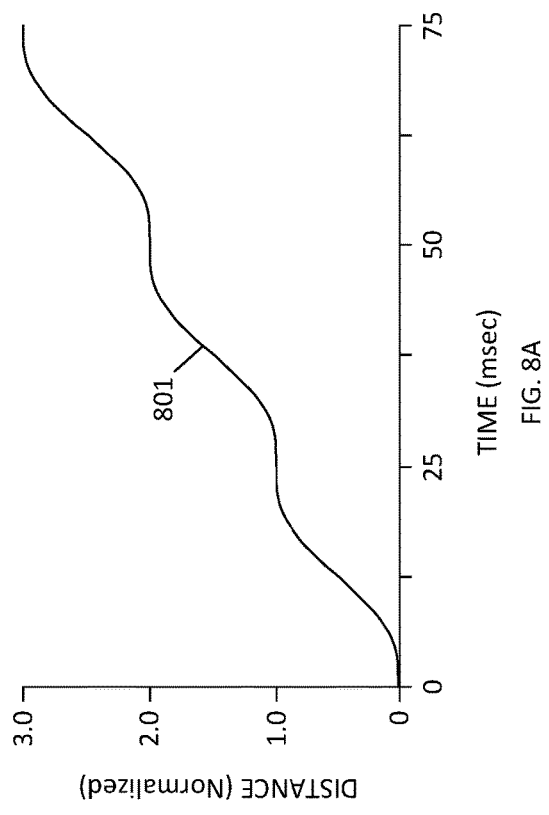
Figure 8B:
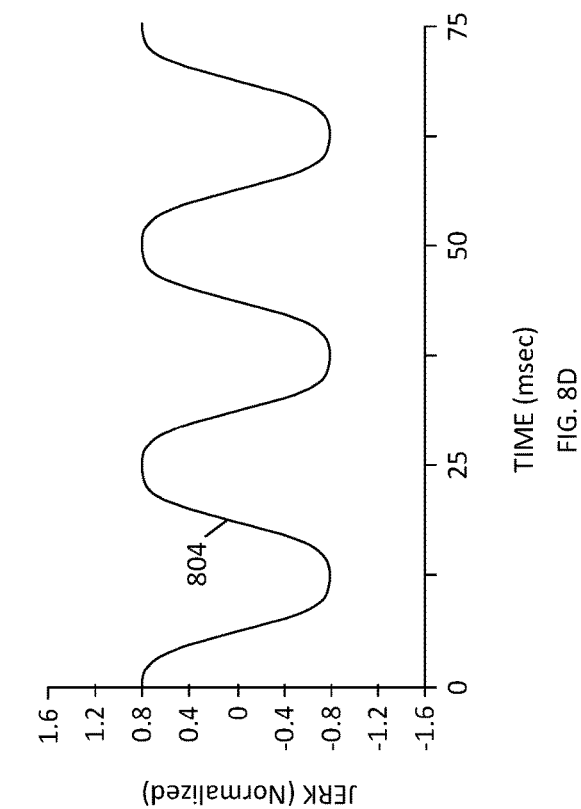
Figure 8D:
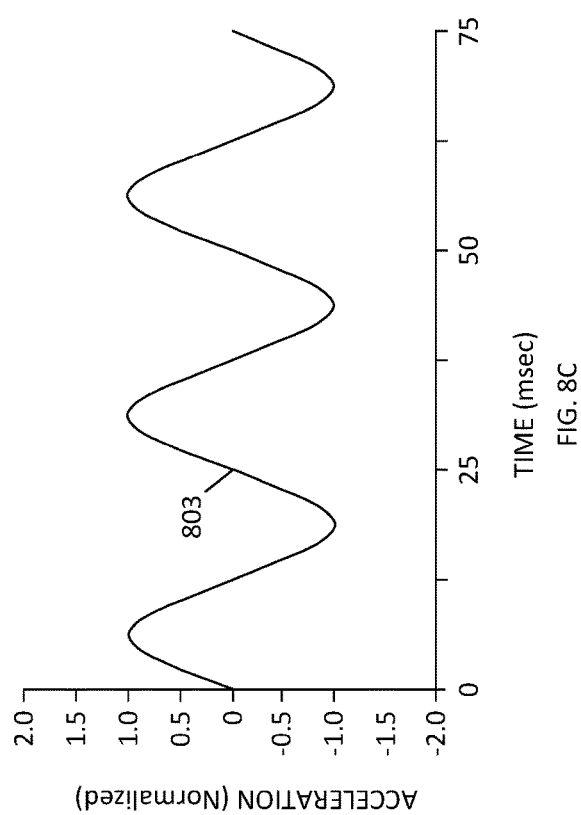

FIGS. 8A-8D illustrate one example of the fourth embodiment, wherein a 10% 3$^{rd}$-harmonic sinusoidal profile is added to a pure sinusoidal profile to reduce the time required to move the stage 250 between adjacent overlay targets while limiting intermediate and higher harmonic vibrations. More specifically, FIGS. 8A, 8B, 8C and 8D are graphs that illustrate the distance traveled by stage 250 between overlay targets, the velocity of stage 250 between overlay targets, the acceleration of stage 250 between overlay targets and the jerk of stage 250 between overlay targets, respectively, in accordance with one example of the fourth embodiment. In this example, adjacent overlay targets are separated by a normalized distance of 1.0 unit, as illustrated by the distance profile 801 of FIG. 8A. The velocity of the stage 250 oscillates between a normalized minimum velocity of 1.0 units and a normalized maximum velocity of 2.0 units as illustrated by the near-sinusoidal velocity profile 802 of FIG. 8B. The acceleration of stage 250 oscillates between a normalized maximum acceleration of 1.0 units, as illustrated by the near-sinusoidal acceleration profile 803 of FIG. 8C. The jerk of stage 250 oscillates between a normalized maximum jerk magnitude of 0.8 units, as illustrated by the profile 804 of FIG. 8D. In the embodiment illustrated by FIGS. 8A-8D, the various profiles 801-804 are not purely sinusoidal, but rather are near-sinusoidal, as these profiles are generated in response to a pure sinusoidal jerk profile with an added 3$^{rd}$ harmonic jerk profile having an amplitude that is 10% of the amplitude of the pure sinusoidal jerk profile. As illustrated by FIG. 8D, the 10% 3$^{rd}$ harmonic profile approximates a smoothed 'square wave' characteristic for the associated jerk profile 804.

Note that adding a 3$^{rd}$ harmonic component to the jerk profile results in the addition of 3$^{rd}$ harmonic components to the acceleration profile and the velocity profile. As illustrated by FIG. 8C, the 10% 3$^{rd}$ harmonic jerk profile approximates a 'triangle wave' characteristic for the associated acceleration profile 803.

As described above, the near-sinusoidal velocity profile 802 is composed of multiple sinusoidal velocity modulations (i.e., a pure sinusoidal velocity modulation and a 3$^{rd}$ harmonic velocity modulation). In this case, the frequencies of the multiple sinusoids (e.g., f and 3*f) are related so that integral full cycles of velocity modulation (e.g., 1 full cycle of velocity modulation) is completed for the composite profile during the move between adjacent overlay targets.

As illustrated by the distance profile 801 of FIG. 8A, it takes stage 250 about 25 msec to move 1.0 distance unit between overlay targets in the illustrated example. Thus, the near-sinusoidal velocity profile 802 enables wafer 301 to be moved between adjacent overlay targets in a manner that may be faster than the pure sinusoidal velocity profile 602 of FIG. 6B (at the expense of higher frequency system vibration, which is described in more detail below in connection with FIG. 8E).

Figure 8E:
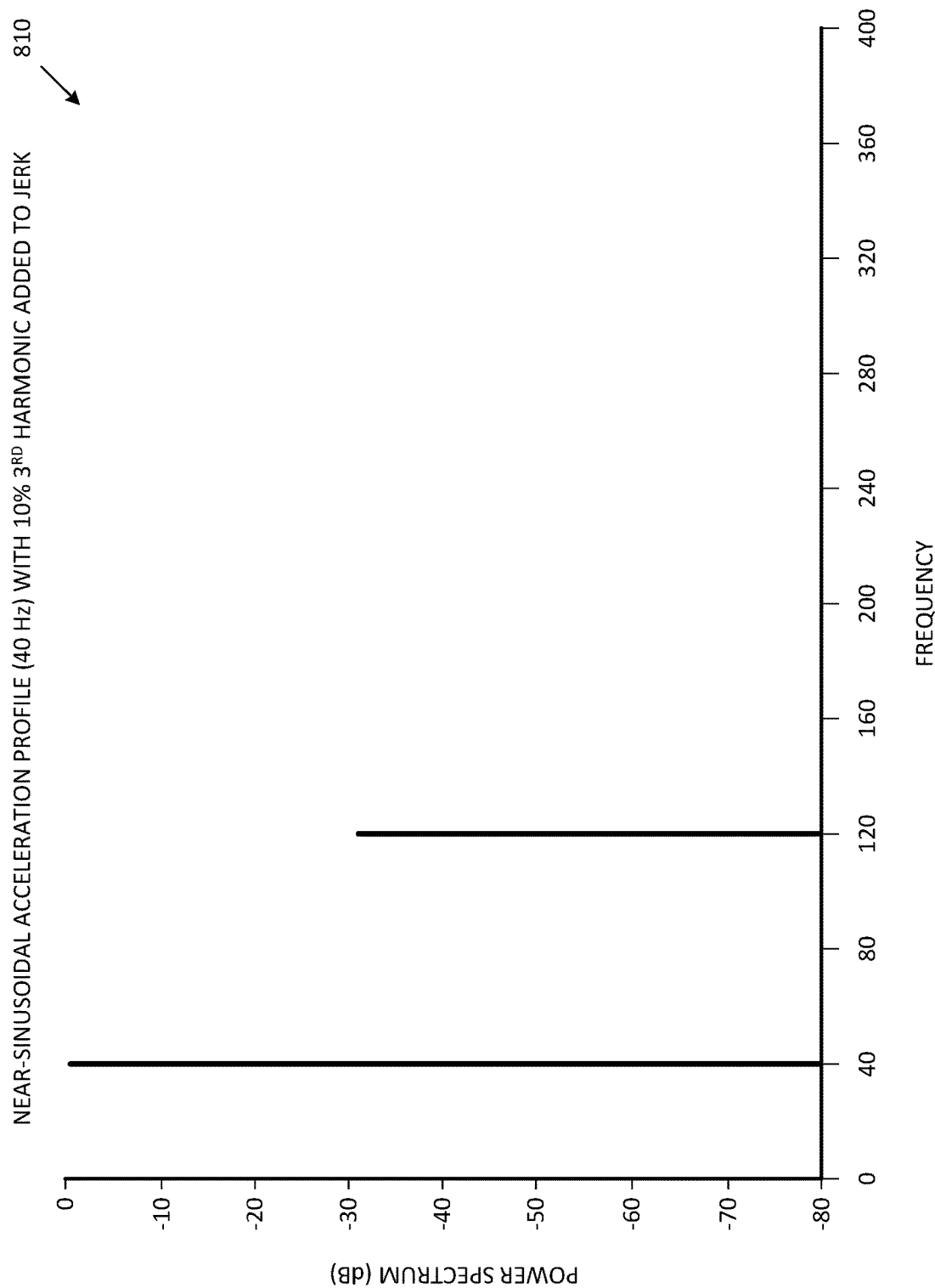
FIG. 8E is a graph illustrating the vibrational forces frequency spectrum for a system using a dual-frequency sinusoidal velocity profile in accordance with the fourth embodiment of the present invention.

FIG. 8E is a graph 810 illustrating the vibrational forces frequency spectrum for a system using a near-sinusoidal acceleration profile (e.g., in accordance with FIGS. 8A-8D) which includes a 40 Hz sinusoidal jerk profile with an added 10% 3$^{rd}$ harmonic (120 Hz) sinusoidal jerk profile, showing the vibration harmonics generated up to 400 Hz. The dual-frequency jerk profile of FIG. 8E results in two vibration harmonics at frequencies of 40 Hz and 120 Hz. These vibration harmonics can be compensated for using the same methods described above in connection with the single frequency vibration harmonic of FIG. 6E. This dual-frequency jerk profile allows the stage 250 to operate at lower peak levels of jerk for the same fundamental frequency of measurement, without destabilizing the system in ways that would prevent accurate TDI measurements from being performed.

Although the example of FIGS. 8A-8D adds a 10% 3$^{rd}$ harmonic profile to a pure sinusoidal profile, it is understood that one or more other harmonic profiles, having other amplitudes, can be added to a pure sinusoidal profile in other embodiments. For example, a 5th harmonic jerk profile can be added to the example of FIGS. 8A-8E. As additional odd harmonic jerk profiles are added, the combined jerk profile will approximate a square wave with increasing fidelity.

Note that in the examples of FIGS. 6E and 8E, wherein the fundamental frequency is the same (i.e., 40 Hz), the inspection rate (measured in overlay targets scanned per second) does not increase, but the distance between adjacent overlay targets would be greater in the example of FIG. 8E (e.g., if the distance between adjacent overlay targets in the example of FIG. 6E is 2 mm, then the distance between adjacent overlay targets in the example of FIG. 8E would be greater than 2 mm) if peak jerk is not changed. If the distance between overlay targets is made the same in the examples of FIGS. 6E and 8E (e.g., the distance between adjacent overlay targets is 2 mm in the examples of FIGS. 6E and 8E), then the vibration magnitudes induced could be lower, at the expense of adding one or more higher frequency components.

In the various embodiments described above, the image velocities may exceed the maximum TDI clock rate when the stage 250 accelerates between the overlay targets. In one embodiment, the TDI sensor 220 is not clocked while overlay target images are not being acquired. In an alternate embodiment, the TDI sensor 220 is clocked at a fixed line rate to improve the thermal stability of the TDI sensor 220 (and camera), or to collect image data with reduced quality in the scan direction, while traveling between the overlay targets.

Advantages of the present invention include the following. The scanning acquisition of overlay target images using the TDI sensor 220 is faster than the acquisition of stationary overlay target images. Scanning acquisition of the overlay target images in accordance with the present invention advantageously does not require deceleration of the stage 250 to a full stop or re-acceleration of the stage 250 from a full stop. Scanning acquisition of the overlay target images in accordance with the present invention also does not require waiting for the system vibrations excited by a full stop to settle before acquiring the overlay target images.

Accelerating the stage 250 after the scanning acquisition of a target overlay image and decelerating the stage 250 before the scanning acquisition of the next target overlay image maximizes the mean stage velocity during the acquisition of images of multiple overlay targets on a wafer. Increasing the mean stage velocity directly increases process throughput.

Following a purely sinusoidal velocity trajectory between the acquisition of adjacent target images introduces only one frequency of induced vibration to the system. Multiple frequencies of induced vibration can excite resonances in other system components which can result in degradations to system performance. In one embodiment, the single frequency of the stage modulation is set to specific values which avoid problematic resonant frequencies in the system.

Although the invention has been described in connection with several embodiments, it is understood that this invention is not limited to the embodiments disclosed, but is capable of various modifications, which would be apparent to a person skilled in the art. For example, although the present invention has been described as using a TDI sensor 220, it is understood that other sensors that obtain images during movement of the overlay target (such as a line sensor) can replace the TDI sensor 220 in other embodiments. In addition, although the present invention has been described in connection with the use of image-based overlay targets, it is understood that the present invention can also be applied to the collection of images of diffraction-based overlay targets. Accordingly, the present invention is limited only by the following claims.

We claim:

1. A method for imaging overlay targets on a wafer comprising:
    using a sensor to acquire images of overlay targets on a wafer while the wafer is in motion; and
    accelerating and decelerating the wafer to move the overlay targets into alignment with the sensor between acquiring images of the overlay targets, wherein the wafer moves without stopping between acquiring the images of the overlay targets and accelerating and decelerating the wafer, and wherein accelerating and decelerating the wafer to move the overlay targets into alignment with the sensor between acquiring images of the overlay targets comprises:
    linearly accelerating the wafer, wherein an acceleration of the wafer linearly increases; then
    linearly decelerating the wafer, wherein an acceleration of the wafer linearly decreases; and then
    linearly accelerating the wafer, wherein an acceleration of the wafer linearly increases.

2. The method of claim 1, wherein the sensor is a time delay integration (TDI) sensor.

3. The method of claim 1, further comprising:
    limiting a jerk of the wafer to a maximum jerk value while linearly accelerating the wafer; and
    limiting the jerk of the wafer to a minimum jerk value while linearly decelerating the wafer.

4. The method of claim 1, further comprising maintaining a constant velocity between the wafer and the sensor while using the sensor to acquire images of the overlay targets.

5. The method of claim 1, wherein a variable velocity exists between the wafer and the sensor while using the sensor to acquire images of the overlay targets.

6. The method of claim 1, wherein the overlay targets are located in a street between die fabricated on the wafer.

7. The method of claim 1, wherein the overlay targets are aligned in a straight line on the wafer.

8. The method of claim 7, wherein the overlay targets are separated by a constant pitch.

9. The method of claim 7, wherein the overlay targets are separated by integral multiples of a single pitch.

10. A method for imaging overlay targets on a wafer comprising:
    using a sensor to acquire images of overlay targets on a wafer while the wafer is in motion; and
    accelerating and decelerating the wafer to move the overlay targets into alignment with the sensor between acquiring images of the overlay targets, wherein accelerating and decelerating the wafer to move the overlay targets into alignment with the sensor between acquiring images of the overlay targets comprises accelerating and decelerating the wafer in a sinusoidal pattern.

11. The method of claim 10, wherein the sinusoidal pattern completes exactly one cycle to move adjacent overlay targets into alignment with the sensor.

12. The method of claim 10, further comprising limiting the accelerating and decelerating by a maximum value.

13. The method of claim 10, further comprising limiting a jerk of the wafer to a maximum value.

14. The method of claim 10, wherein a velocity of the wafer follows a sinusoidal pattern while accelerating and decelerating the wafer.

15. The method of claim 14, wherein a jerk of the wafer follows a sinusoidal pattern while accelerating and decelerating the wafer.

16. The method of claim 10, wherein accelerating and decelerating the wafer results in a frequency of velocity modulation, wherein exactly one full cycle of velocity modulation is completed to move adjacent overlay targets into alignment with the sensor.

17. A method for imaging overlay targets on a wafer comprising:
using a sensor to acquire images of overlay targets on a wafer while the wafer is in motion; and
accelerating and decelerating the wafer to move the overlay targets into alignment with the sensor between acquiring images of the overlay targets, wherein accelerating and decelerating the wafer comprises accelerating and decelerating the wafer along a trajectory composed of two or more sinusoidal velocity modulations, wherein the frequencies of the sinusoidal velocity modulations are set so that integral full cycles of velocity modulation are completed to move adjacent overlay targets into alignment with the sensor.

18. The method of claim 17, wherein the two or more sinusoidal velocity modulations include a pure sinusoidal velocity modulation and a harmonic of the pure sinusoidal velocity modulation.

19. A system for imaging overlay targets on a wafer comprising:
a sensor for acquiring images of overlay targets on a wafer while the wafer is in motion; and
a controller for accelerating and decelerating the wafer to move the overlay targets into alignment with the sensor between acquiring images of the overlay targets, wherein the controller continuously moves the wafer without stopping between acquiring the images of the overlay targets and accelerating and decelerating the wafer, and wherein accelerating and decelerating the wafer to move the overlay targets into alignment with the sensor between acquiring images of the overlay targets comprises:
linearly accelerating the wafer, wherein an acceleration of the wafer linearly increases; then
linearly decelerating the wafer, wherein an acceleration of the wafer linearly decreases; and then
linearly accelerating the wafer, wherein an acceleration of the wafer linearly increases.

20. The system of claim 19, wherein the sensor is a time delay integration (TDI) sensor.

21. The system of claim 19, wherein the overlay targets are aligned in a straight line on the wafer.

22. The method of claim 21, wherein the overlay targets are separated by a constant pitch.

23. The method of claim 21, wherein the overlay targets are separated by integral multiples of a single pitch.

24. A system for imaging overlay targets on a wafer comprising:
a sensor for acquiring images of overlay targets on a wafer while the wafer is in motion; and
a controller for accelerating and decelerating the wafer to move the overlay targets into alignment with the sensor between acquiring images of the overlay targets, wherein accelerating and decelerating the wafer to move the overlay targets into alignment with the sensor between acquiring images of the overlay targets comprises accelerating and decelerating the wafer in a sinusoidal pattern.

25. A system for imaging overlay targets on a wafer comprising:
a sensor for acquiring images of overlay targets on a wafer while the wafer is in motion; and
a controller for accelerating and decelerating the wafer to move the overlay targets into alignment with the sensor between acquiring images of the overlay targets, wherein accelerating and decelerating the wafer comprises accelerating and decelerating the wafer along a trajectory composed of two or more sinusoidal velocity modulations, wherein the frequencies of the sinusoidal velocity modulations are set so that integral full cycles of velocity modulation are completed to move adjacent overlay targets into alignment with the sensor.

26. The system of claim 25, wherein the two or more sinusoidal velocity modulations include a pure sinusoidal velocity modulation and a harmonic of the pure sinusoidal velocity modulation.

* * * * *